United States Patent
Vu et al.

(10) Patent No.: US 11,128,796 B1
(45) Date of Patent: Sep. 21, 2021

(54) HIGH DYNAMIC RANGE IMAGE SENSOR WITH A NEUTRAL DENSITY FILTER

(71) Applicant: SEMICONDUCTOR COMPONENTS INDUSTRIES, LLC, Phoenix, AZ (US)

(72) Inventors: Amanda Thuy Trang Vu, Nampa, ID (US); Swarnal Borthakur, Boise, ID (US); Ulrich Boettiger, Garden City, ID (US); Stanley Micinski, Meridian, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 59 days.

(21) Appl. No.: 16/808,096

(22) Filed: Mar. 3, 2020

(51) Int. Cl.
*H04N 5/232* (2006.01)
*H04N 5/225* (2006.01)
*H04N 9/04* (2006.01)

(52) U.S. Cl.
CPC ....... *H04N 5/23229* (2013.01); *H04N 5/2254* (2013.01); *H04N 9/04551* (2018.08)

(58) Field of Classification Search
CPC ........... H04N 5/23229; H04N 9/04551; H04N 5/2254
See application file for complete search history.

(56) References Cited

U.S. PATENT DOCUMENTS

| | | | |
|---|---|---|---|
| 8,345,144 B1* | 1/2013 | Georgiev | G03B 11/00 348/340 |
| 2007/0035653 A1 | 2/2007 | Hong et al. | |
| 2008/0303919 A1* | 12/2008 | Egawa | G06T 1/0007 348/223.1 |
| 2010/0053385 A1 | 3/2010 | Choe et al. | |
| 2013/0215238 A1* | 8/2013 | Yamazaki | H04N 5/3696 348/49 |
| 2013/0335533 A1* | 12/2013 | Yamazaki | H04N 9/04555 348/49 |
| 2015/0350583 A1* | 12/2015 | Mauritzson | H04N 5/374 250/208.1 |
| 2018/0226445 A1 | 8/2018 | Lu et al. | |

* cited by examiner

*Primary Examiner* — Shahbaz Nazrul
(74) *Attorney, Agent, or Firm* — Treyz Law Group, P.C.; Joseph F. Guihan

(57) ABSTRACT

A high dynamic range image sensor may include a plurality of pixel groups. One or more pixel groups may include attenuated pixels in addition to unattenuated pixels. The unattenuated pixels may include a photosensitive area, a color filter element and a microlens of a first size. Each attenuated pixel may include a photosensitive area, a color filter element, a neutral density filter, and a microlens of a second size that is smaller than the first size. The color filter elements for each pixel in a given pixel group may be the same color. The neutral density filter may attenuate light for the attenuated pixels, increasing dynamic range of the image sensor. The microlenses of varying sizes may redirect light from attenuated pixels towards unattenuated pixels, further increasing the dynamic range.

20 Claims, 10 Drawing Sheets

HIGH DYNAMIC RANGE IMAGE SENSOR WITH A NEUTRAL DENSITY FILTER

BACKGROUND

This relates generally to imaging devices, and more particularly, to imaging devices having high dynamic range imaging pixels.

Image sensors are commonly used in electronic devices such as cellular telephones, cameras, and computers to capture images. In a typical arrangement, an image sensor includes an array of image pixels arranged in pixel rows and pixel columns. Circuitry may be coupled to each pixel column for reading out image signals from the image pixels. Typical image pixels contain a photodiode for generating charge in response to incident light. Image pixels may also include a charge storage region for storing charge that is generated in the photodiode. Image sensors can operate using a global shutter or a rolling shutter scheme.

Some conventional image sensors may be able to operate in a high dynamic range (HDR) mode. HDR operation may be accomplished in image sensors by assigning alternate rows of pixels different integration times. However, conventional HDR image sensors may sometimes experience lower than desired resolution, lower than desired sensitivity, higher than desired noise levels, and lower than desired quantum efficiency.

It would therefore be desirable to be able to provide improved high dynamic range operation in image sensors.

DETAILED DESCRIPTION

Embodiments of the present invention relate to image sensors. It will be recognized by one skilled in the art that the present exemplary embodiments may be practiced without some or all of these specific details. In other instances, well-known operations have not been described in detail in order not to unnecessarily obscure the present embodiments.

Electronic devices such as digital cameras, computers, cellular telephones, and other electronic devices may include image sensors that gather incoming light to capture an image. The image sensors may include arrays of pixels. The pixels in the image sensors may include photosensitive elements such as photodiodes that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the pixels and readout circuitry for reading out image signals corresponding to the electric charge generated by the photosensitive elements.

Figure 1:
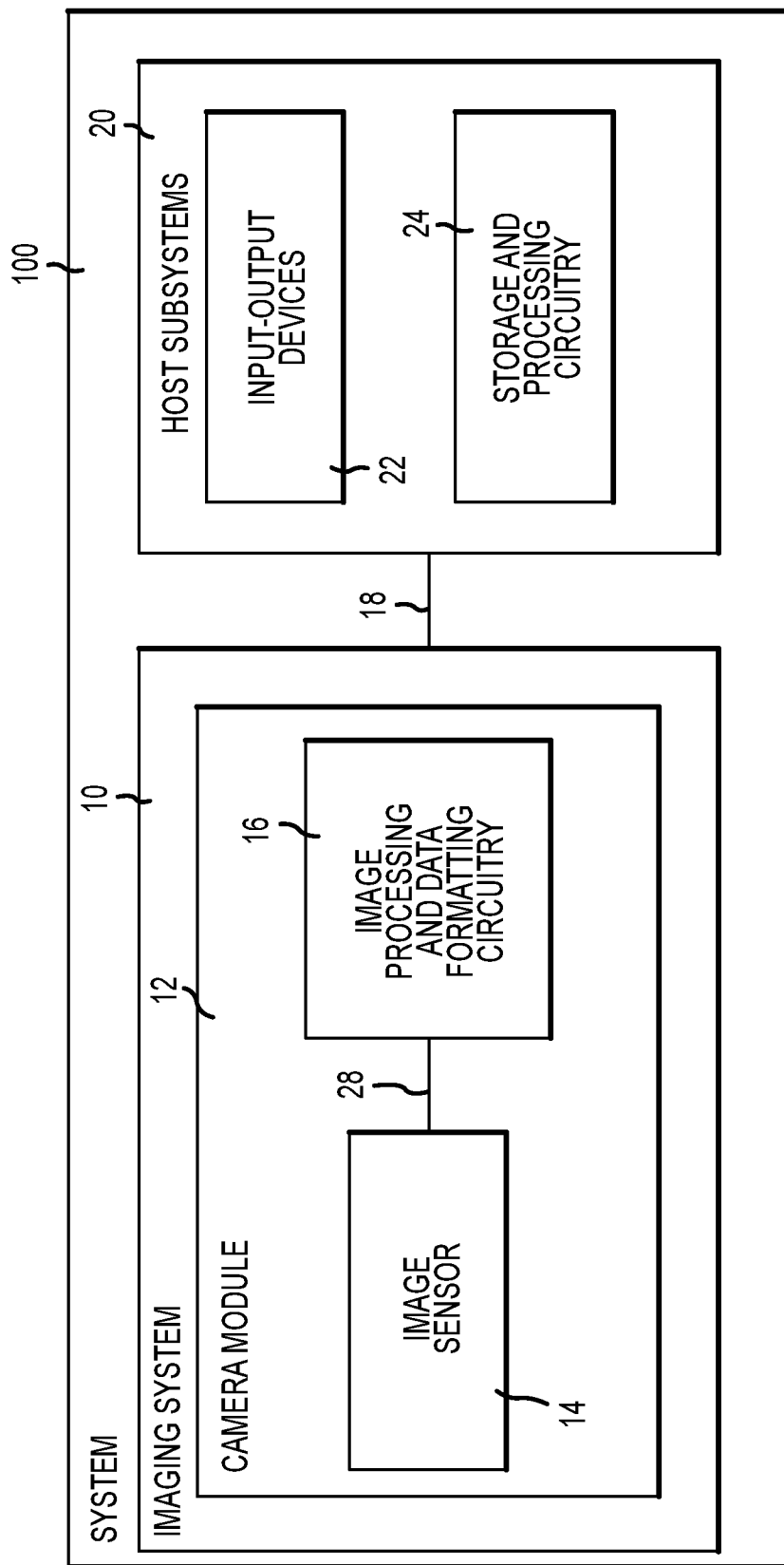
FIG. 1 is a diagram of an illustrative electronic device having an image sensor in accordance with an embodiment.

FIG. 1 is a diagram of an illustrative imaging and response system including an imaging system that uses an image sensor to capture images. System 100 of FIG. 1 may be an electronic device such as a camera, a cellular telephone, a video camera, or other electronic device that captures digital image data, may be a vehicle safety system (e.g., an active braking system or other vehicle safety system), may be a surveillance system, or may be any other desired type of system.

As shown in FIG. 1, system 100 may include an imaging system such as imaging system 10 and host subsystems such as host subsystem 20. Imaging system 10 may include camera module 12. Camera module 12 may include one or more image sensors 14 and one or more lenses.

Each image sensor in camera module 12 may be identical or there may be different types of image sensors in a given image sensor array integrated circuit. During image capture operations, each lens may focus light onto an associated image sensor 14. Image sensor 14 may include photosensitive elements (i.e., pixels) that convert the light into digital data. Image sensors may have any number of pixels (e.g., hundreds, thousands, millions, or more). A typical image sensor may, for example, have millions of pixels (e.g., megapixels). As examples, image sensor 14 may include bias circuitry (e.g., source follower load circuits), sample and hold circuitry, correlated double sampling (CDS) circuitry, amplifier circuitry, analog-to-digital converter circuitry, data output circuitry, memory (e.g., buffer circuitry), address circuitry, etc.

Still and video image data from camera sensor 14 may be provided to image processing and data formatting circuitry 16 via path 28. Path 28 may be a connection through a serializer/deserializer (SERDES) which is used for high speed communication and may be especially useful in automotive systems. Image processing and data formatting circuitry 16 may be used to perform image processing functions such as data formatting, adjusting white balance and exposure, implementing video image stabilization, face detection, etc. Image processing and data formatting circuitry 16 may also be used to compress raw camera image files if desired (e.g., to Joint Photographic Experts Group or JPEG format). In a typical arrangement, which is sometimes referred to as a system on chip (SOC) arrangement, camera sensor 14 and image processing and data formatting circuitry 16 are implemented on a common semiconductor substrate (e.g., a common silicon image sensor integrated circuit die). If desired, camera sensor 14 and image processing circuitry 16 may be formed on separate semiconductor substrates. For example, camera sensor 14 and image processing circuitry 16 may be formed on separate substrates that have been stacked.

Imaging system 10 (e.g., image processing and data formatting circuitry 16) may convey acquired image data to host subsystem 20 over path 18. Path 18 may also be a connection through SERDES. Host subsystem 20 may include processing software for detecting objects in images, detecting motion of objects between image frames, determining distances to objects in images, filtering or otherwise processing images provided by imaging system 10.

If desired, system 100 may provide a user with numerous high-level functions. In a computer or advanced cellular telephone, for example, a user may be provided with the ability to run user applications. To implement these functions, host subsystem 20 of system 100 may have input-output devices 22 such as keypads, input-output ports, joysticks, and displays and storage and processing circuitry 24. Storage and processing circuitry 24 may include volatile and nonvolatile memory (e.g., random-access memory, flash memory, hard drives, solid-state drives, etc.). Storage and processing circuitry 24 may also include microprocessors, microcontrollers, digital signal processors, application specific integrated circuits, etc.

Figure 2:
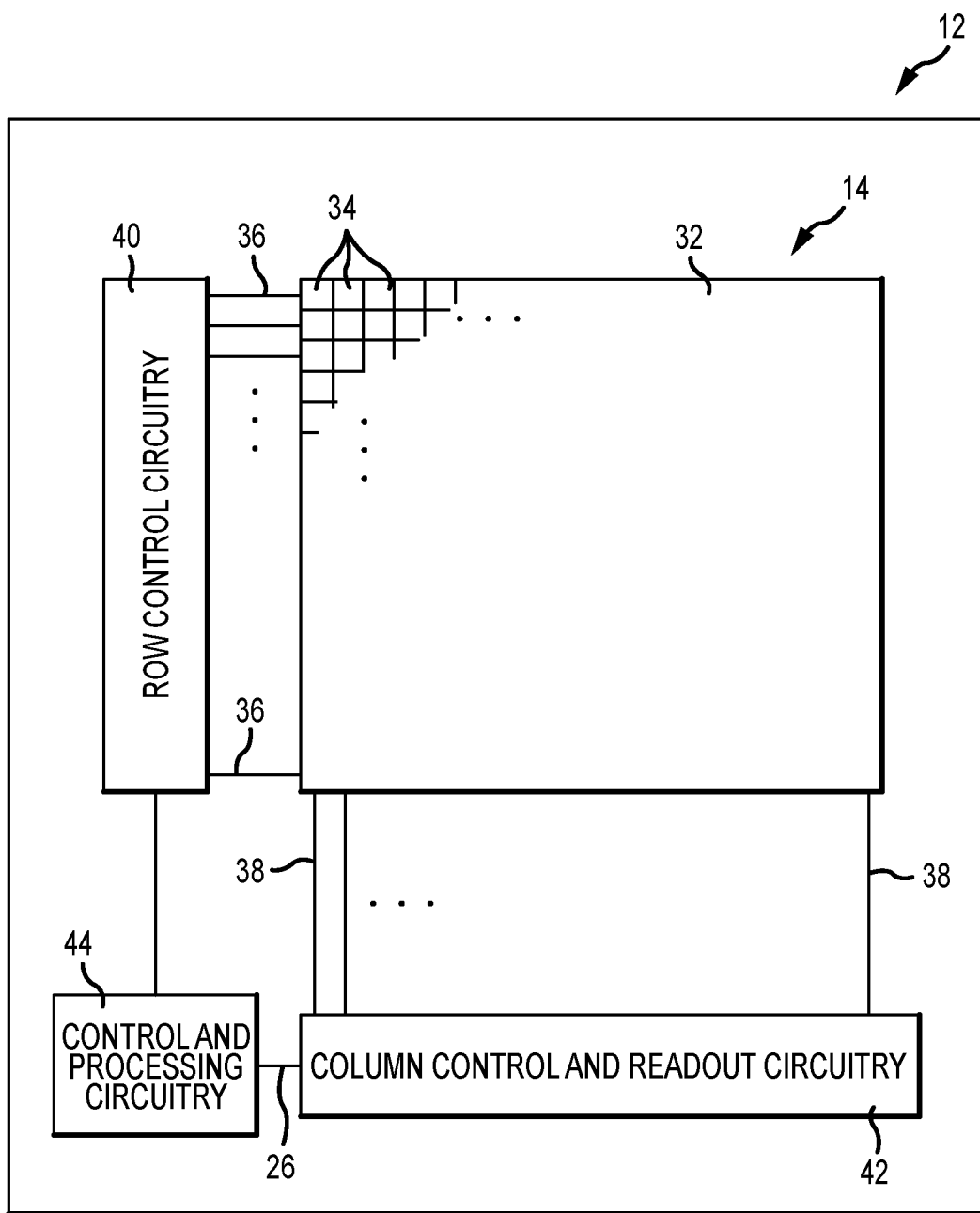
FIG. 2 is a diagram of an illustrative pixel array and associated readout circuitry for reading out image signals in an image sensor in accordance with an embodiment.

An example of an arrangement for camera module 12 of FIG. 1 is shown in FIG. 2. As shown in FIG. 2, camera module 12 includes image sensor 14 and control and processing circuitry 44. Control and processing circuitry 44 may correspond to image processing and data formatting circuitry 16 in FIG. 1. Image sensor 14 may include a pixel array such as array 32 of pixels 34 (sometimes referred to herein as image sensor pixels, imaging pixels, or image pixels 34) and may also include control circuitry 40 and 42. Control and processing circuitry 44 may be coupled to row control circuitry 40 and may be coupled to column control and readout circuitry 42 via data path 26. Row control circuitry 40 may receive row addresses from control and processing circuitry 44 and may supply corresponding row control signals to image pixels 34 over control paths 36 (e.g., dual conversion gain control signals, pixel reset control signals, charge transfer control signals, blooming control signals, row select control signals, or any other desired pixel control signals). Column control and readout circuitry 42 may be coupled to the columns of pixel array 32 via one or more conductive lines such as column lines 38. Column lines 38 may be coupled to each column of image pixels 34 in image pixel array 32 (e.g., each column of pixels may be coupled to a corresponding column line 38). Column lines 38 may be used for reading out image signals from image pixels 34 and for supplying bias signals (e.g., bias currents or bias voltages) to image pixels 34. During image pixel readout operations, a pixel row in image pixel array 32 may be selected using row control circuitry 40 and image data associated with image pixels 34 of that pixel row may be read out by column control and readout circuitry 42 on column lines 38.

Column control and readout circuitry 42 may include column circuitry such as column amplifiers for amplifying signals read out from array 32, sample and hold circuitry for sampling and storing signals read out from array 32, analog-to-digital converter circuits for converting read out analog signals to corresponding digital signals, and column memory for storing the read out signals and any other desired data. Column control and readout circuitry 42 may output digital pixel values to control and processing circuitry 44 over line 26.

Array 32 may have any number of rows and columns. In general, the size of array 32 and the number of rows and columns in array 32 will depend on the particular implementation of image sensor 14. While rows and columns are generally described herein as being horizontal and vertical, respectively, rows and columns may refer to any grid-like structure (e.g., features described herein as rows may be arranged vertically and features described herein as columns may be arranged horizontally).

Pixel array 32 may be provided with a color filter array having multiple color filter elements which allows a single image sensor to sample light of different colors. As an example, image sensor pixels such as the image pixels in array 32 may be provided with a color filter array which allows a single image sensor to sample red, green, and blue (RGB) light using corresponding red, green, and blue image sensor pixels arranged in a Bayer mosaic pattern. The Bayer mosaic pattern consists of a repeating unit cell of two-by-two image pixels, with two green image pixels diagonally opposite one another and adjacent to a red image pixel diagonally opposite to a blue image pixel. In another suitable example, the green pixels in a Bayer pattern are replaced by broadband image pixels having broadband color filter elements (e.g., clear color filter elements, yellow color filter elements, etc.). These examples are merely illustrative and, in general, color filter elements of any desired color and in any desired pattern may be formed over any desired number of image pixels 34.

If desired, array 32 may be part of a stacked-die arrangement in which pixels 34 of array 32 are split between two or more stacked substrates. In such an arrangement, each of the pixels 34 in the array 32 may be split between the two dies at any desired node within the pixel. As an example, a node such as the floating diffusion node may be formed across two dies. Pixel circuitry that includes the photodiode and the circuitry coupled between the photodiode and the desired node (such as the floating diffusion node, in the present example) may be formed on a first die, and the remaining pixel circuitry may be formed on a second die. The desired node may be formed on (i.e., as a part of) a coupling structure (such as a conductive pad, a micro-pad, a conductive interconnect structure, or a conductive via) that connects the two dies. Before the two dies are bonded, the coupling structure may have a first portion on the first die and may have a second portion on the second die. The first die and the second die may be bonded to each other such that first portion of the coupling structure and the second portion of the coupling structure are bonded together and are electrically coupled. If desired, the first and second portions of the coupling structure may be compression bonded to each other. However, this is merely illustrative. If desired, the first and second portions of the coupling structures formed on the respective first and second dies may be bonded together using any metal-to-metal bonding technique, such as soldering or welding.

As mentioned above, the desired node in the pixel circuit that is split across the two dies may be a floating diffusion node. Alternatively, the desired node in the pixel circuit that is split across the two dies may be the node between a floating diffusion region and the gate of a source follower transistor (i.e., the floating diffusion node may be formed on the first die on which the photodiode is formed, while the coupling structure may connect the floating diffusion node to the source follower transistor on the second die), the node between a floating diffusion region and a source-drain node of a transfer transistor (i.e., the floating diffusion node may be formed on the second die on which the photodiode is not located), the node between a source-drain node of a source follower transistor and a row select transistor, or any other desired node of the pixel circuit.

In general, array 32, row control circuitry 40, column control and readout circuitry 42, and control and processing circuitry 44 may be split between two or more stacked substrates. In one example, array 32 may be formed in a first substrate and row control circuitry 40, column control and readout circuitry 42, and control and processing circuitry 44 may be formed in a second substrate. In another example, array 32 may be split between first and second substrates (using one of the pixel splitting schemes described above) and row control circuitry 40, column control and readout circuitry 42, and control and processing circuitry 44 may be formed in a third substrate.

To increase the dynamic range of the image sensor, imaging pixels within the image sensor may be arranged in pixel groups. Each pixel group may include two or more pixels. At least one pixel in each group may receive attenuated light. By attenuating the light provided to that pixel, the amount of light required to saturate the pixel is increased. This improves the performance of the image sensor in high light conditions. One or more additional pixels within each pixel group may not be attenuated to preserve performance in low light conditions.

The light may be selectively attenuated using gray filters (sometimes referred to as neutral density filters or gray filter elements). Additionally, microlenses of different sizes (and/or shapes) may be used to direct light away from the attenuated pixel to an unattenuated pixel.

Figure 3:
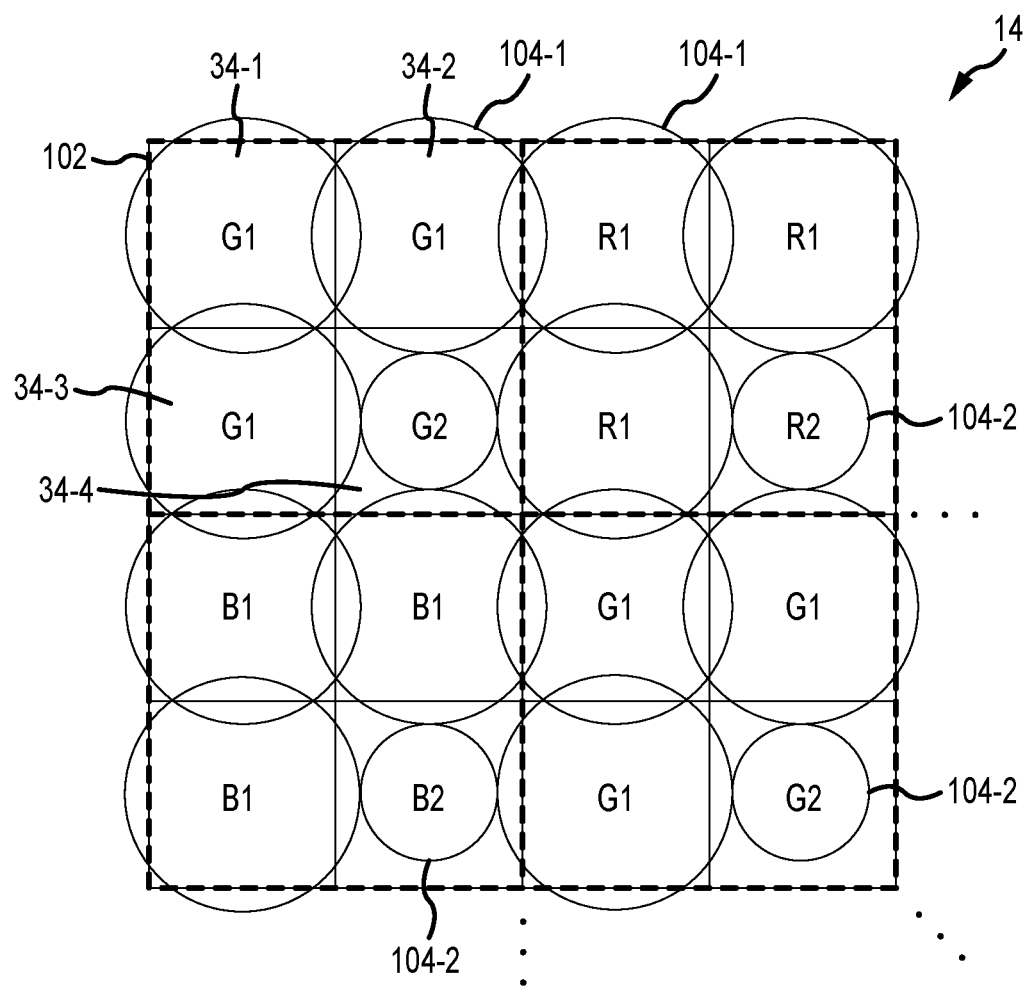
FIG. 3 is a top view of an illustrative image sensor having pixel groups with attenuated pixels in accordance with an embodiment.

FIG. 3 is a top view of an illustrative image sensor with pixel groups and a neutral density to increase dynamic range. As shown in FIG. 3, the pixels may be arranged in a plurality of groups 102. In FIG. 3, each pixel group 102 includes four pixels in a 2×2 arrangement. For example, pixel 34-1, pixel 34-2, pixel 34-3, and pixel 34-4 are arranged in a 2×2 grid. Each pixel may include a corresponding photosensitive area (e.g., a photodiode).

Pixels 34-1, 34-2, and 34-3 may be covered by a green color filter element and may be optimized for low light conditions (these pixels are therefore labeled 'G1' in FIG. 3). In other words, pixels 34-1, 34-2, and 34-3 do not include an additional light attenuator beyond the green color filter element (and therefore may be referred to as unattenuated pixels). Meanwhile, pixel 34-4 may be covered by both a green color filter element and a gray filter element that additionally attenuates light (and therefore may be referred to as an attenuated pixel). Pixel 34-4 may be optimized for high light conditions. Pixel 34-4 may therefore be labeled 'G2' in FIG. 3.

Therefore, pixel group 102 includes an attenuated pixel G2 in addition to unattenuated pixels G1. This allows for both low light levels and high light levels to be measured, increasing dynamic range of the image sensor.

The pixels labeled B1 may include blue color filters and may be optimized for low light conditions. The pixels labeled B2 may include blue color filters and gray filters and may be optimized for high light conditions. The pixels labeled R1 may include red color filters and may be optimized for low light conditions. The pixels labeled R2 may include red color filters and gray filters and may be optimized for high light conditions. Each pixel group in FIG. 3 includes at least one pixel that has a neutral density filter to attenuate light (e.g., B2 and R2). In general, it is desirable for the high light pixels (e.g., the pixels optimized to capture images in high light conditions) to receive less light than the low light pixels (e.g., the pixels optimized to capture images in low light conditions). This is why the high light pixels are attenuated and the low light pixels are not.

In addition to including a neutral density filter to attenuate light for the high light pixels (G2, R2, and B2), the image sensor may include microlenses of different sizes to redirect light from the attenuated pixels (G2, R2, and B2) to the unattenuated pixels (G1, R1, and B1). Each unattenuated pixel is covered by a respective microlens 104-1 whereas each attenuated pixel is covered by a respective microlens 104-2. Microlenses 104-1 are larger than microlenses 104-2. For example, microlenses 104-1 may have a diameter that is greater than the diameter of microlens 104-2 and/or microlens 104-1 may have a height (thickness) that is greater than the height of microlens 104-2. The microlenses 104-1 will therefore redirect light from attenuated pixels to unattenuated pixels, further increasing the dynamic range of the image sensor.

It should be understood that there are various nomenclature options for describing the arrangements of the type shown herein. In one example, the grouped pixels of the same color may be referred to as a pixel group (or pixel block) and each photosensitive area may be referred to as an imaging pixel (or as part of an imaging pixel). However, in another example, the grouped pixels of the same color may be referred to as a pixel and each photosensitive area may be referred to as a sub-pixel. Herein, the terminology of a pixel group including a number of pixels will generally be used.

It should be noted that the arrangement of FIG. 3 is merely illustrative. In some image sensors, only green pixel groups (or pixel groups of another given color) may include an attenuated pixel instead of having attenuated pixels in groups of every color as in FIG. 3. In FIG. 3, the lower-right pixel of each pixel group is attenuated. This example is merely illustrative and the position of the attenuated pixel within the pixel group may vary. The arrangement of the pixel groups is also optional. Instead of a 2×2 arrangement as in FIG. 3, the pixel groups may have a 3×3 arrangement, 4×4 arrangement, or any other desired arrangement (e.g., a non-square rectangular arrangement such as a 1×2 or 2×1 arrangement, a concentric arrangement where a first, ring-shaped photosensitive area laterally surrounds a second photosensitive area, etc.). Within a given color, only some pixel groups may have an attenuated pixel. For example, some green pixel groups may have an attenuated pixel whereas some green pixel groups may not have an attenuated pixel. The pixel groups having an attenuated pixel may be scattered randomly across the pixel array or arranged in any desired pattern. The density and distribution of pixel groups having an attenuated pixel may vary across the pixel array.

In FIG. 3, the pixel groups are covered by a Bayer color filter pattern. In other words, there is a repeating unit cell of two-by-two pixel groups, with two green pixel groups diagonally opposite one another and adjacent to a red pixel group diagonally opposite to a blue pixel group. This example is merely illustrative, however, and any desired color filter pattern may be used. The green pixel groups in a Bayer pattern may be replaced by broadband image pixels having broadband color filter elements (e.g., clear color filter elements, yellow color filter elements, etc.). These examples are merely illustrative and, in general, color filter elements of any desired color and in any desired pattern may be formed over any desired number of pixel groups 102.

There are numerous ways to form an image sensor with neutral density filters and microlenses of the type shown in FIG. 3. FIGS. 4A-4D are cross-sectional side views showing an illustrative method of forming an image sensor with neutral density filters.

Figure 4A:
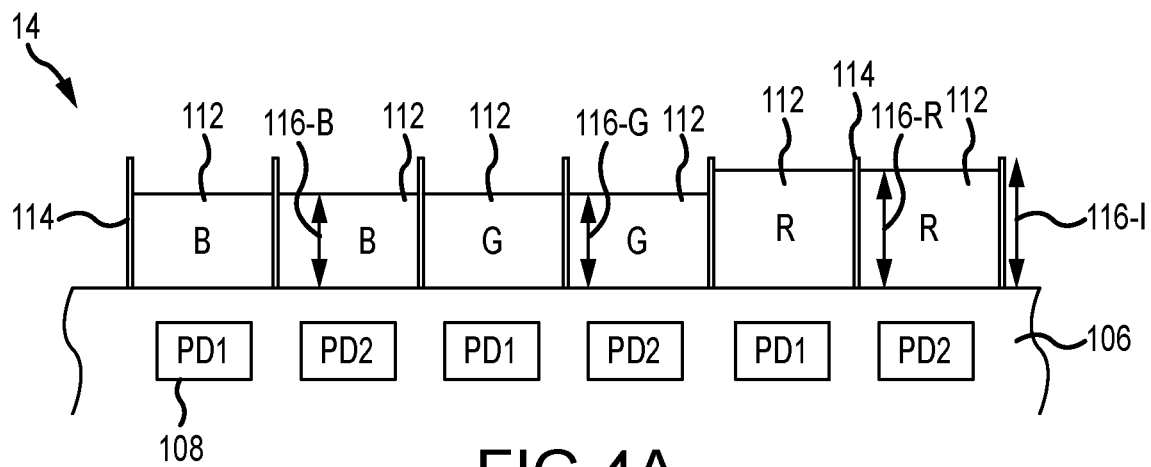
FIGS. 4A-4D are cross-sectional side views of an image sensor showing an illustrative method for forming an image sensor with attenuated pixels in accordance with an embodiment.

FIG. 4A is a cross-sectional side view of the image sensor 14 after an initial color filter deposition step. As shown, the image sensor includes a plurality of photosensitive areas 108 formed in a semiconductor substrate 106. Semiconductor substrate 106 may be formed from silicon, for example. Photosensitive areas 108 may be photodiodes (PDs). The photodiodes for low light imaging pixels (e.g., unattenuated pixels) are labeled PD1 whereas the photodiodes for high light imaging pixels (e.g., attenuated pixels) are labeled PD2. The photodiodes for the low light and high light imaging pixels may be arranged in a uniform grid across the pixel array. Alternatively, the low light and high light imaging pixels may be additionally modified (e.g., in light collecting area, in doping concentration, etc.) to optimize the photodiodes for the low or high light conditions.

Color filter elements 112 are formed over substrate 106 between composite grid 114. The composite grid may be formed from an oxide material (e.g., silicon dioxide) and a metal material (e.g., tungsten) in one example. The composite grid is an example of an isolation structure and therefore may sometimes be referred to as isolation structure 114. The isolation structure 114 may prevent cross-talk between adjacent color filter elements and pixels. Additional isolation structures may be used in place of the composite grid. For example, isolation structure 114 may instead be formed only from metal, formed only from an oxide material, or formed from another desired material.

As shown in FIG. 4A, the color filter elements may optionally have different thicknesses depending upon color. The blue color filter elements have a thickness 116-B, the green color filter elements have a thickness 116-G, and the red color filter elements have a thickness 116-R. In FIG. 4A, the thickness 116-R is greater than thickness 116-B and thickness 116-G. Thicknesses 116-B and 116-G are equal. These examples are merely illustrative and each color filter element may have any desired thickness.

Thickness 116-R may be between 300 nanometers and 1,000 nanometers, between 600 nanometers and 700 nanometers, between 640 nanometers and 660 nanometers, less than 700 nanometers, greater than 600 nanometers, etc. Thickness 116-B may be between 300 nanometers and 1,000 nanometers, between 500 nanometers and 600 nanometers, between 540 nanometers and 560 nanometers, less than 600 nanometers, greater than 500 nanometers, etc. Thickness 116-G may be between 300 nanometers and 1,000 nanometers, between 500 nanometers and 600 nanometers, between 540 nanometers and 560 nanometers, less than 600 nanometers, greater than 500 nanometers, etc. The difference between thickness 116-R and thicknesses 116-B/116-G may be between 50 nanometers and 150 nanometers, greater than 50 nanometers, greater than 10 nanometers, less than 200 nanometers, between 90 nanometers and 110 nanometers, etc.

Isolation structures 114 may have a thickness 116-I. Thickness 116-I may be between 300 nanometers and 1,000 nanometers, between 700 nanometers and 800 nanometers, between 740 nanometers and 760 nanometers, less than 800 nanometers, greater than 700 nanometers, etc. The difference between thickness 116-I and thicknesses 116-R may be between 50 nanometers and 150 nanometers, greater than 50 nanometers, greater than 10 nanometers, less than 200 nanometers, between 90 nanometers and 110 nanometers, etc.

Figure 4B:
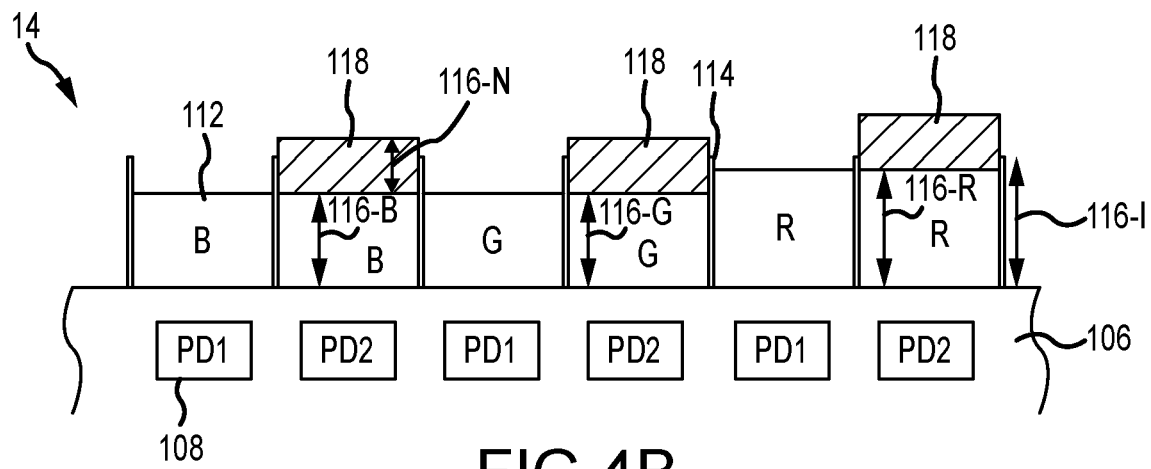

FIG. 4B is a cross-sectional side view of the image sensor 14 after adding a neutral density filter to the color filter elements of FIG. 4A. As shown, a gray filter element 118 (sometimes referred to as a neutral density filter 118) is formed over the color filter element of each attenuated pixel. As shown in connection with FIG. 3, one out of four pixels in a pixel group may be provided with the gray filter element. Any other desired neutral density filter arrangement may be used as discussed above.

Each neutral density filter may have a thickness 116-N. Thickness 116-N may be between 100 nanometers and 1,000 nanometers, between 100 nanometers and 500 nanometers, between 200 nanometers and 400 nanometers, between 290 nanometers and 310 nanometers, less than 400 nanometers, greater than 200 nanometers, etc. The thickness of the neutral density filters may be selected to allow for easy manufacturing (e.g., planarization as in FIG. 4C) and to reduce interference as light travels through the optical stack. The transmission of the neutral density filter may be less than 60%, less than 50%, less than 30%, less than 15%, less than 10%, less than 5%, less than 1%, between 1% and 30%, between 5% and 20%, greater than 1%, etc.

The gray filter elements may be formed using photolithography (photo-patterning). In other words, a uniform layer of the gray filter element material may be deposited across the image sensor. If the gray filter element material has photoactive components it can be exposed with a suitable wavelength (example i-line at 365 nm) and then the areas where it is not needed can be developed out similar to a photolithography process. Alternately, if the material is not photoactive a separate photolithography process may be used to remove (etch) the gray filter element material over the unattenuated pixels. The remaining gray filter element material forms gray filter elements over the attenuated pixels. The combination of a color filter element (e.g., a red, blue, or green color filter element) with a gray filter element (e.g., a neutral density filter) may sometimes be referred to as a filter stack or optical stack.

Figure 4C:
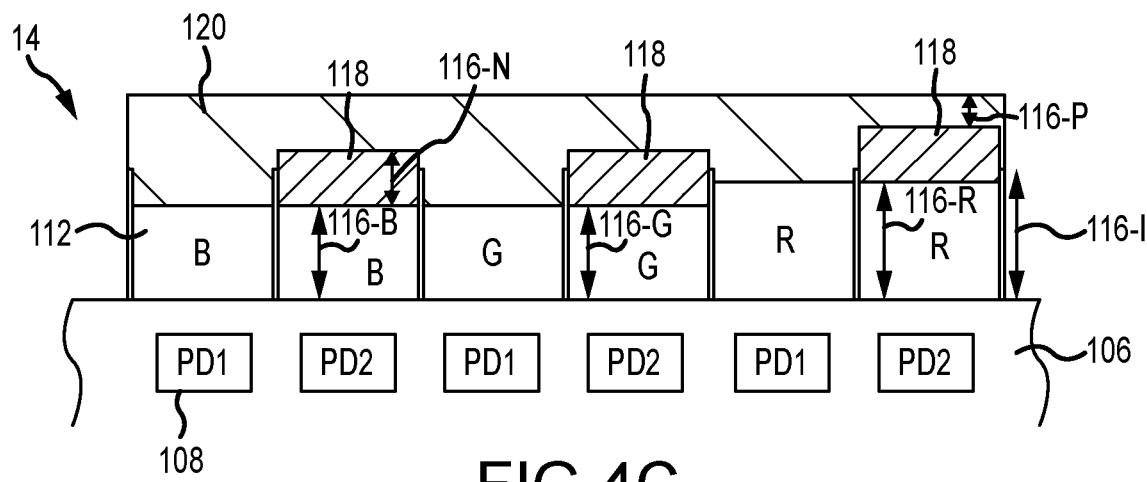

FIG. 4C is a cross-sectional side view of the image sensor 14 after adding a planarization layer to the color filter elements of FIG. 4B. As shown, planarization layer 120 may be formed over the entire image sensor. The planarization layer 120 may cover and directly contact the color filter elements of the unattenuated pixels and the neutral density filters of the attenuated pixels. The thickness 116-P of the planarization layer over the neutral density filter of the red imaging pixel may be between 100 nanometers and 200 nanometers, greater than 100 nanometers, greater than 10 nanometers, less than 200 nanometers, between 140 nanometers and 160 nanometers, etc.

Figure 4D:
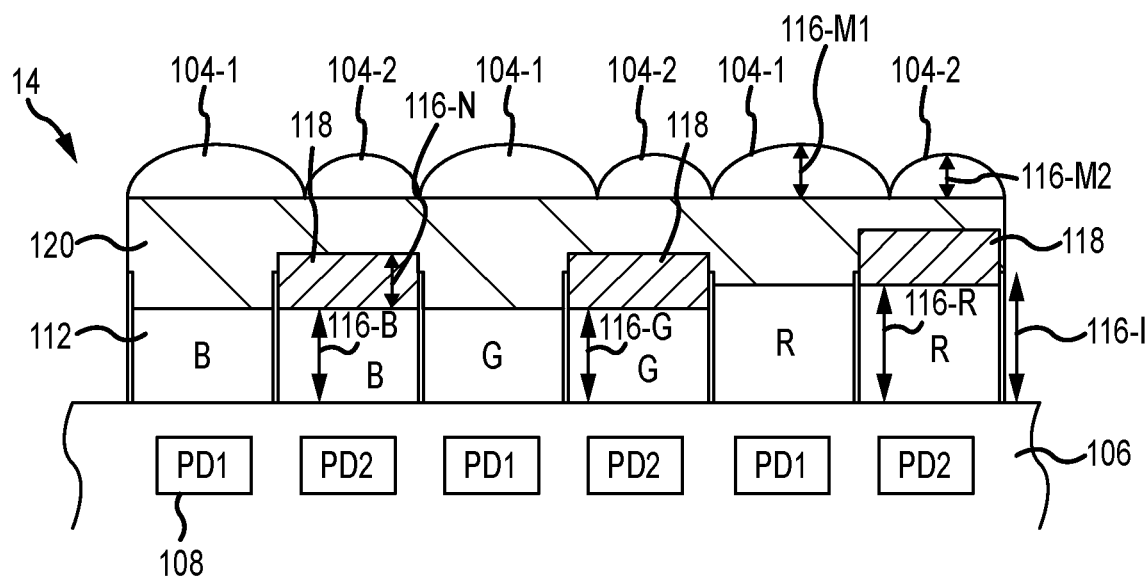

FIG. 4D is a cross-sectional side view of the image sensor 14 after adding microlenses to the image sensor of FIG. 4C. As shown, microlenses 104-1 may be formed over each unattenuated pixel (e.g., each pixel without a neutral density filter) and microlenses 104-2 may be formed over each attenuated pixel (e.g., each pixel with a neutral density filter). As show in FIG. 4D, microlenses 104-1 are larger than the microlenses 104-2. The attenuated pixels may be overlapped by portions of one or more large microlenses 104-1 in addition to their respective small microlens 104-2. In this way, light may be redirected from the attenuated pixels to the unattenuated pixels.

Microlenses 104-1 may have a thickness 116-M1 whereas microlenses 104-2 may have a thickness 116-M2. The thickness 116-M1 may be between 200 nanometers and 500 nanometers, greater than 300 nanometers, greater than 150 nanometers, less than 400 nanometers, less than 750 nanometers, between 300 nanometers and 400 nanometers, between 340 nanometers and 360 nanometers, etc. The thickness 116-M2 may be between 200 nanometers and 500 nanometers, greater than 250 nanometers, greater than 150 nanometers, less than 350 nanometers, less than 750 nanometers, between 250 nanometers and 350 nanometers, between 280 nanometers and 300 nanometers, etc. Thickness 116-M2 may be greater than thickness 116-M1 by any desired amount.

In general, color filter elements 112, neutral density filters 118, planarization layer 120, microlenses 104-1, and microlenses 104-2 may be formed from any desired materials. The color filter elements 112 and neutral density filters 118 may be formed from organic or inorganic materials. Microlenses 104-1 and 104-2 may be formed by etching (e.g., a layer of material is deposited then etched to form the desired microlens shapes) or reflow (e.g., a layer of material is patterned and then heated to form the desired microlens shapes). The microlenses may be formed from polymer material, silicon nitride, or any other desired material. Planarization layer 120 may be formed from a transparent material such as silicon dioxide, a photoresist material, or any other desired material.

In general, color filter elements 112, neutral density filters 118, planarization layer 120, microlenses 104-1, and microlenses 104-2 may have any desired refractive indices.

Figure 5:
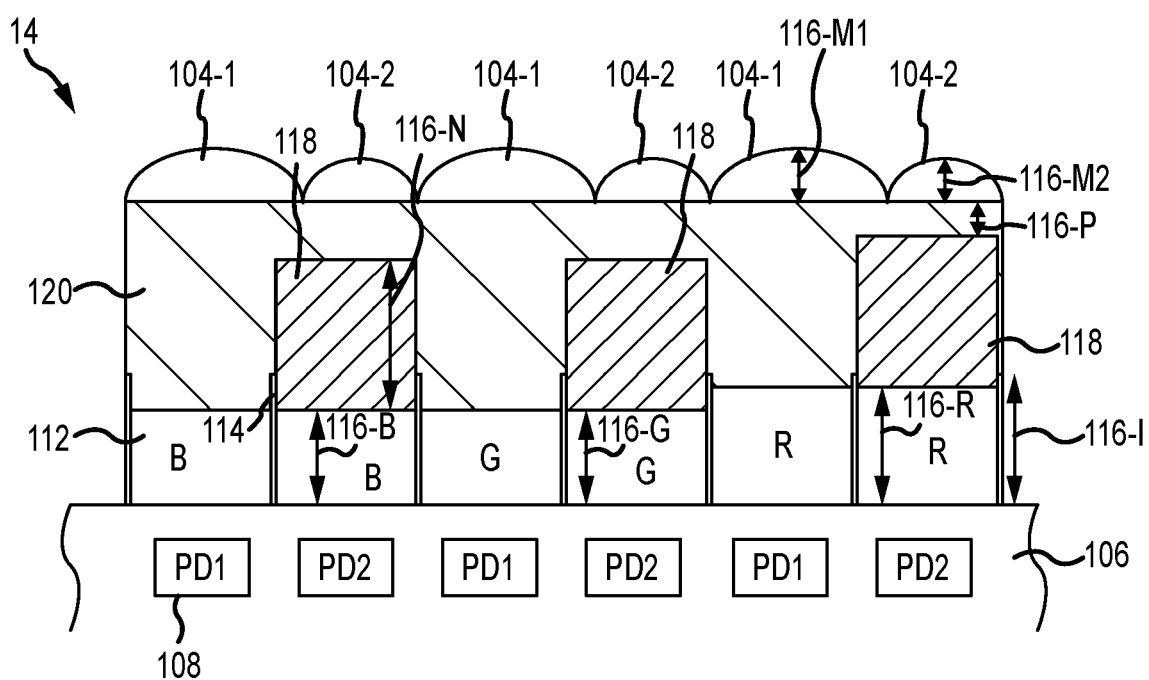
FIG. 5 is a cross-sectional side view of an illustrative image sensor having color filter elements and neutral density filters that are thicker than the color filter elements in accordance with an embodiment.

The method of forming the high dynamic range image sensor shown in FIGS. 4A-4D is merely illustrative. If desired, other methods may be used and the image sensor may have different final arrangements. In the image sensor of FIG. 4D, the neutral density filters have a thickness that is smaller than the thickness of the color filter elements 112 and of isolation 114. This example is merely illustrative. FIG. 5 is a cross-sectional side view of an illustrative image sensor with neutral density filters that are thicker than the color filter elements.

As shown in FIG. 5, neutral density filter thickness 116-N is greater than thicknesses 116-B, 116-G, 116-R, and 116-I. Thickness 116-N may be greater than 800 nanometers, greater than 700 nanometers, less than 2,000 nanometers, between 800 nanometers and 1,000 nanometers, between 750 nanometers and 1,500 nanometers, between 850 nanometers and 950 nanometers, between 890 nanometers and 910 nanometers, etc. The transmission of the neutral density filter may be less than 60%, less than 50%, less than 30%, less than 15%, less than 10%, less than 5%, less than 1%, etc. The thicker neutral density filter of FIG. 5 may allow for greater light reduction than the neutral density filter of FIG. 4D.

Figure 6:
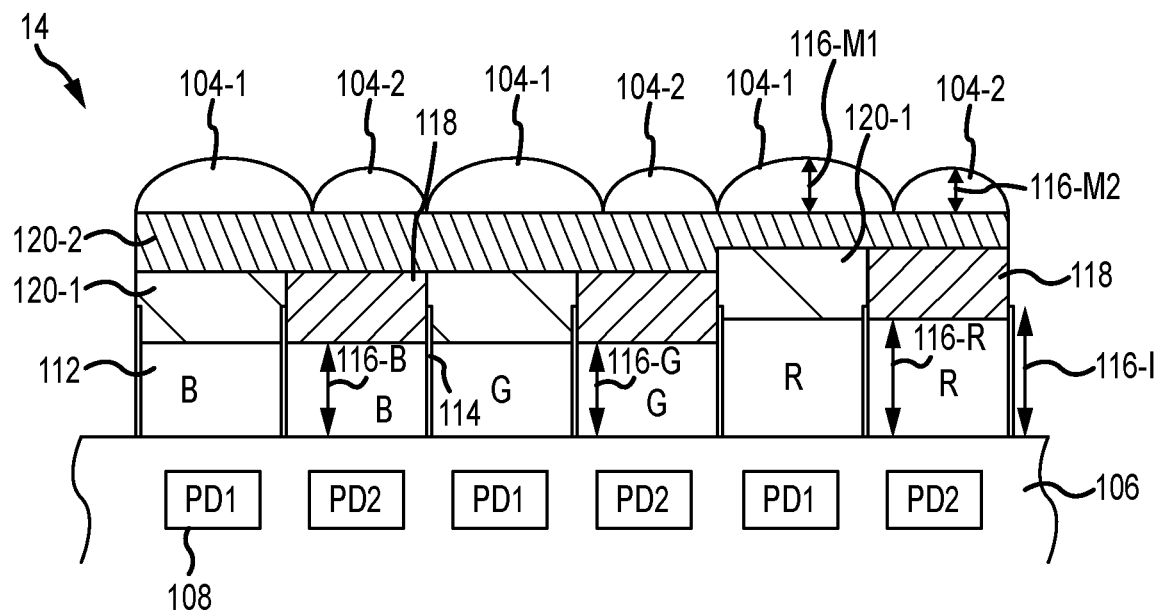
FIG. 6 is a cross-sectional side view of an illustrative image sensor having neutral density filters and color filter elements covered by two planarization layers in accordance with an embodiment.

In FIGS. 4D and 5, a single planarization layer 120 is formed over color filter elements 112 and neutral density filters 118. This example is merely illustrative. As shown in FIG. 6, two planarization layers may instead be formed over the color filter elements 112 and neutral density filters. To form an image sensor of this type, similar steps may be taken as in FIGS. 4A-4D. First, color filter elements 112 may be formed between isolation structures 114. Next, neutral density filters may be selectively formed over some of the pixels (e.g., one pixel in each pixel group as in FIG. 3). Then, planarization layer 120-1 may be formed over color filter elements 112. Planarization layer 120-1 may be deposited, exposed, and developed or etched using photolithography in one example. The thickness of the planarization layer 120-1 may be the same as the thickness of neutral density filters 118. Planarization layer 120-1 may be coplanar with neutral density filters 118. Planarization layer 120-1 may only be formed over the unattenuated pixels.

After forming planarization layer 120-1, additional planarization layer 120-2 may be formed over planarization layer 120-1. Planarization layer 120-2 may also be formed using photolithography if desired. The planarization layer 120-2 covers planarization layer 120-1 and a color filter element 112 in the unattenuated pixels. Planarization layer 120-2 covers a neutral density filter 118 and a color filter element 112 in the attenuated pixels.

Using two planarization layers as in FIG. 6 may allow for better planarization over the filter stacks. This technique may be used for any desired neutral density filter thickness (e.g., when the neutral density filters are thicker than the color filter elements as in FIG. 5). Planarization layers 120-1 and 120-2 as well as neutral density filters 118 may have ultraviolet (UV) light filtering capabilities that mitigate UV degradation in color filter elements 112.

After forming the planarization layers, the image sensor of FIG. 6 has the microlenses 104-1 and 104-2 formed over the planarization layer 120-2, similar to as discussed in connection with FIG. 4D.

Figure 7:
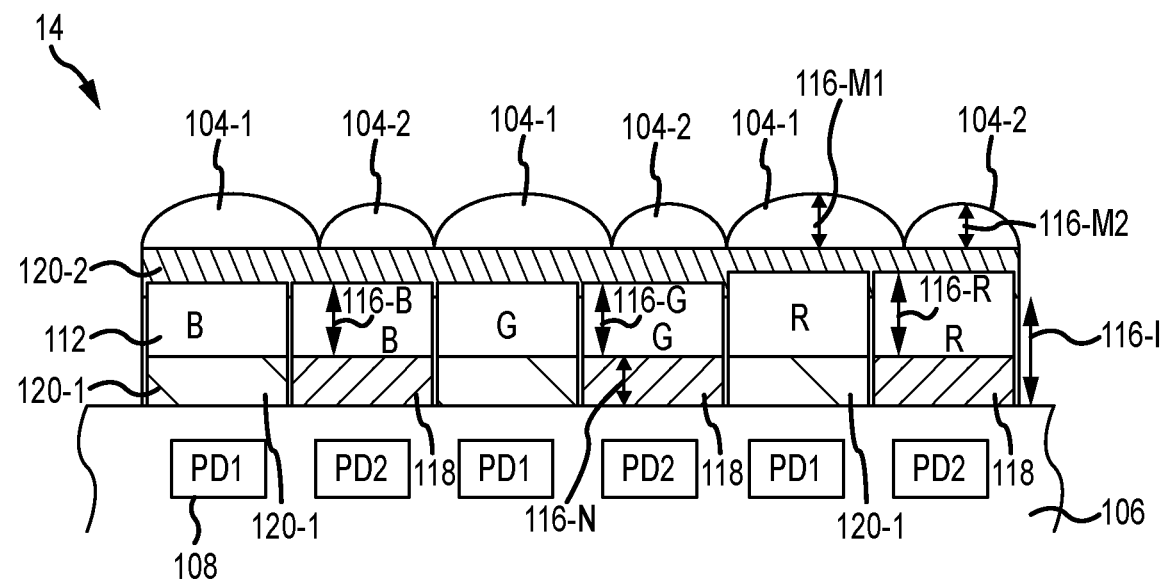
FIG. 7 is a cross-sectional side view of an illustrative image sensor having neutral density filters formed below color filter elements in accordance with an embodiment.

The neutral density filters may optionally be patterned before the color filters in the image sensor. FIG. 7 is a cross-sectional side view of an image sensor with neutral density filters below the color filter elements. Gray filter material may first be deposited over substrate 106 to form neutral density filters 118. Then, a clear planarization material 120-1 may be patterned over the unattenuated pixels. The red, green, and blue color filter elements are then patterned across the pixel array. Planarization layer 120-2 may then be formed over the color filter elements. Finally, microlenses 104-1 and 104-2 may be formed over planarization layer 120-2.

The thicknesses of the components in FIG. 7 may the same as any of the thicknesses discussed in connection with FIGS. 4-6. In the example of FIG. 7, the thickness 116-N of the neutral density filter is smaller than the thicknesses of the red, blue, and green color filter elements. However, similar to as shown and discussed in FIG. 5, the neutral density filter may instead be thicker than the red, blue, and green color filter elements.

Figure 8:
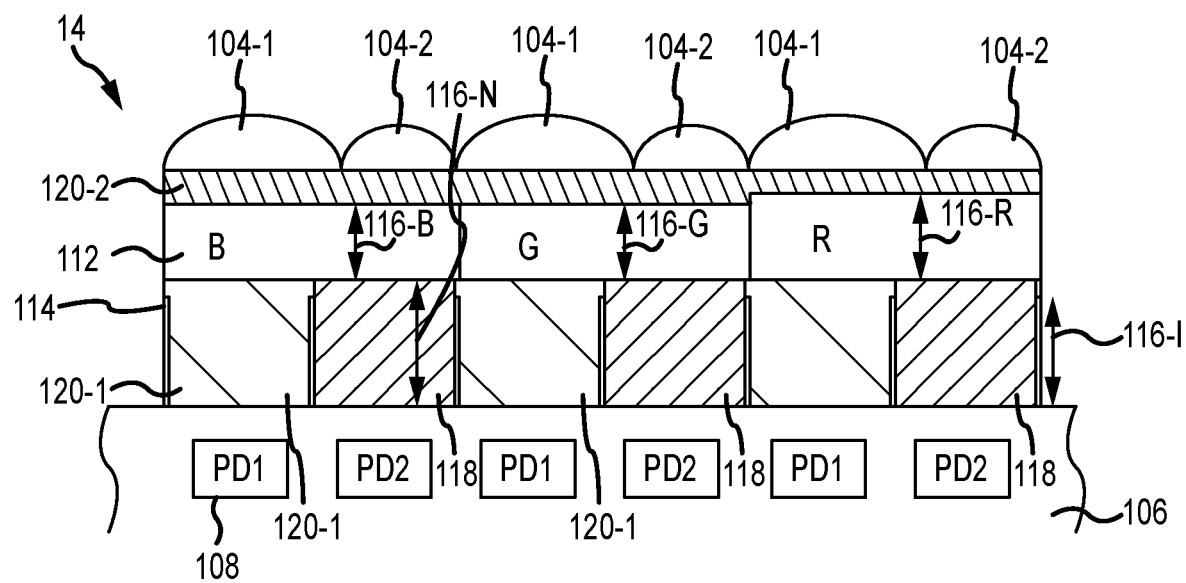
FIG. 8 is a cross-sectional side view of an illustrative image sensor having neutral density filters that are formed below color filter elements and that are thicker than the color filter elements in accordance with an embodiment.

FIG. 8 is a cross-sectional side view of an image sensor with neutral density filters formed underneath color filter elements (as in FIG. 7) and with thick neutral density filters (as in FIG. 5). As shown in FIG. 8, clear planarization layer 120-1 and neutral density filters 118 are formed on substrate 106. Color filter elements 112 are then formed over the clear planarization layer 120-1 and neutral density filters 118. In FIG. 8, neutral density filters 118 have a thickness 116-N that is greater than thickness 116-I of the isolation structures 114. Accordingly, the neutral density filters extend taller than the isolation structures 114. Planarization layer 120-1 has the same thickness as the neutral density filters. Planarization layer 120-1 and the neutral density filters 118 are coplanar. Planarization layer 120-1 and neutral density filters 118 may therefore form a planar surface upon which the color filter elements 112 are deposited (above the top of isolation structures 114).

The arrangement of FIG. 8 allows for the color filter elements 112 to be formed continuously over the entire pixel group (e.g., over a 2×2 grid of photodiodes). This may be an easier manufacturing technique than forming the color filter elements between isolation structures 114 for each pixel as in FIGS. 4A and 5-7).

Figure 9:
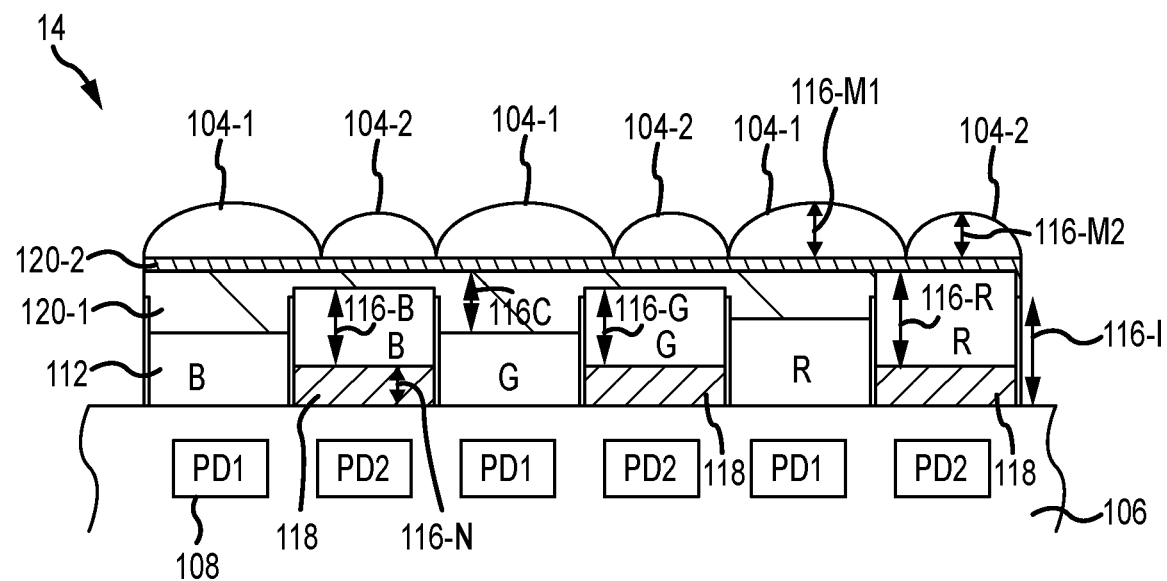
FIG. 9 is a cross-sectional side view of an illustrative image sensor having neutral density filters that are coplanar with color filter elements in accordance with an embodiment.

FIG. 9 shows an alternate arrangement for an image sensor with the neutral density filters formed underneath the color filters. In FIG. 9, gray filter material may first be deposited over substrate 106 to form neutral density filters 118. Then, the red, green, and blue color filter elements 112 are patterned across the pixel array. Some of the color filter elements 112 are formed directly on substrate 106 (in unattenuated pixels) whereas others are formed on neutral density filters 118 (in attenuated pixels). Neutral density filters 118 of the attenuated pixels may therefore be coplanar with color filter elements of the unattenuated pixels. Next, a clear planarization material 120-1 may be patterned over the array. Planarization layer 120-1 may have a maximum thickness 116-C as shown in FIG. 9. Thickness 116-C may be between 200 nanometers and 500 nanometers, greater than 300 nanometers, greater than 150 nanometers, less than 600 nanometers, less than 450 nanometers, between 350 nanometers and 450 nanometers, between 390 nanometers and 410 nanometers, etc. Planarization layer 120-2 may then be formed over planarization layer 120-1. Finally, microlenses 104-1 and 104-2 may be formed over planarization layer 120-2.

The example of FIG. 9 is merely illustrative. In FIG. 9, neutral density filters 118 have a thickness 116-N that is lower than thicknesses 116-B, 116-G, and 116-R of the color filter elements. However, neutral density filters 118 may instead have a thickness 116-N that is greater than thicknesses 116-B, 116-G, and 116-R of the color filter elements (e.g., as shown in FIGS. 5 and 8).

The previous arrangements have depicted the red, blue, and green color filter elements as having the same thickness over the attenuated and unattenuated pixels. Similarly, the previous arrangements have depicted the thickness of each neutral density filter as being the same. However, these examples are merely illustrative and the thicknesses may vary if desired.

The neutral density filter may have an uneven transmission across the visible wavelengths. In one specific example, at a given neutral density filter thickness, the transmission may be slightly different for green light than for blue light. It therefore may be desirable to tune the thickness of the neutral density filters depending on the color of pixel. In any of the preceding arrangements, the gray filter material may be deposited in two or more photolithography steps to allow for two or more unique neutral density filter thicknesses.

In one example, attenuated blue pixels may have a neutral density filter of a first thickness, attenuated green pixels may have a neutral density filter of a second thickness, and attenuated red pixels may have a neutral density filter of a third thickness. The second thickness may be less than the first thickness. The third thickness may be less than the first thickness but greater than the first thickness. The thicknesses may differ by between 25 nanometers and 150 nanometers, greater than 50 nanometers, greater than 10 nanometers, less than 200 nanometers, between 90 nanometers and 110 nanometers, between 40 nanometers and 60 nanometers, etc. In one illustrative arrangement, the neutral density filter for the blue attenuated pixel has a thickness of 900 nanometers, the neutral density filter for the green attenuated pixel has a thickness of 800 nanometers, and the neutral density filter for the blue attenuated pixel has a thickness of 850 nanometers.

Color filter elements 112 may also have different thicknesses in attenuated and unattenuated pixels. For example, the green color filter element in an unattenuated pixel in a pixel group may have a different thickness than the green color filter element in an attenuated pixel in that pixel group. The thicknesses of color filter elements of the same color may differ by between 25 nanometers and 150 nanometers, greater than 50 nanometers, greater than 10 nanometers, less than 200 nanometers, between 90 nanometers and 110 nanometers, between 40 nanometers and 60 nanometers, etc.

To provide color filter elements of the same color but different thicknesses, the color filter elements of a single color may be formed in two or more photolithography steps. For example, the color filters for the attenuated pixels may be formed first and then the color filters for the unattenuated pixels may be formed next.

The foregoing is merely illustrative of the principles of this invention and various modifications can be made by those skilled in the art. The foregoing embodiments may be implemented individually or in any combination.

What is claimed is:

1. An image sensor that includes a pixel group, the pixel group comprising:
    an attenuated pixel;
    an unattenuated pixel;
    color filtering material of a given color that covers both the attenuated pixel and the unattenuated pixel;
    a neutral density filter that covers the attenuated pixel but not the unattenuated pixel; and
    a microlens that covers the unattenuated pixel and at least a portion of the attenuated pixel.

2. The image sensor defined in claim 1, wherein the microlens is configured to redirect light from the attenuated pixel to the unattenuated pixel.

3. The image sensor defined in claim 1, wherein the microlens is a first microlens and wherein the pixel group comprises:
    a second microlens formed over the attenuated pixel, wherein the second microlens is smaller than the first microlens.

4. The image sensor defined in claim 1, wherein the pixel group comprises first and second color filter elements including the color filtering material of the given color and wherein the first and second color filter elements respectively cover the unattenuated pixel and the attenuated pixel.

5. The image sensor defined in claim 4, wherein the neutral density filter is formed over the second color filter element.

6. The image sensor defined in claim 4, wherein the pixel group comprises:
    a planarization layer that is formed over the neutral density filter.

7. The image sensor defined in claim 6, wherein the pixel group comprises:
    an additional planarization layer that is interposed between the first color filter element and the planarization layer.

8. The image sensor defined in claim 4, wherein the second color filter element has a first thickness, wherein the neutral density filter has a second thickness, and wherein the first thickness is greater than the first thickness.

9. The image sensor defined in claim 4, wherein the second color filter element has a first thickness, wherein the neutral density filter has a second thickness, and wherein the first thickness is less than the first thickness.

10. The image sensor defined in claim 4, wherein the second color filter element is formed over the neutral density filter.

11. The image sensor defined in claim 10, wherein the pixel group further comprises:
    a first planarization layer, wherein the first color filter element is formed over the first planarization layer; and
    a second planarization layer, wherein the second planarization layer is formed over the first and second color filter elements.

12. The image sensor defined in claim 10, wherein the pixel group further comprises:
a first planarization layer, wherein the first planarization layer is formed over the first color filter element; and
a second planarization layer, wherein the second planarization layer is formed over the first planarization layer.

13. The image sensor defined in claim 4, wherein the pixel group comprises:
a composite grid that separates the first color filter element from the second color filter element.

14. An image sensor that includes a pixel group, the pixel group comprising:
at least one pixel of a first type, wherein each pixel of the first type includes a photosensitive area, a color filter element and a microlens of a first size; and
at least one pixel of a second type, wherein each pixel of the second type includes a photosensitive area, a color filter element, a neutral density filter, and a microlens of a second size that is smaller than the first size.

15. The image sensor defined in claim 14, wherein, for each pixel of the second type, the color filter element is interposed between the photosensitive area and the neutral density filter.

16. The image sensor defined in claim 14, wherein, for each pixel of the second type, the neutral density filter is interposed between the photosensitive area and the color filter element.

17. The image sensor defined in claim 14, wherein, for each pixel of the first type, the color filter element is a given color, and wherein, for each pixel of the second type, the color filter element is the given color.

18. The image sensor defined in claim 14, wherein the photosensitive area for each pixel of the first type is overlapped by at least a portion of one microlens of the second size in addition to the microlens of the first size.

19. An image sensor comprising:
a first photosensitive area;
a second photosensitive area;
color filter material of a given color that overlaps both the first and second photosensitive areas;
gray filter material that overlaps the second photosensitive area, wherein the first photosensitive area is not overlapped by gray filter material;
a first microlens that overlaps the first photosensitive area; and
a second microlens that overlaps the second photosensitive area and that is smaller than the first microlens.

20. The image sensor defined in claim 19, wherein the given color is a color selected from the group consisting of: red, green, and blue.

* * * * *